(12) United States Patent
Jeong et al.

(10) Patent No.: US 8,705,640 B2
(45) Date of Patent: *Apr. 22, 2014

(54) DIGITAL BROADCAST TRANSMISSION AND RECEIVING SYSTEM HAVING AN IMPROVED RECEIVING PERFORMANCE AND SIGNAL PROCESSING METHOD THEREOF

(75) Inventors: Hae-joo Jeong, Seoul (KR); Yong-deok Chang, Suwon-si (KR); Eui-jun Park, Seoul (KR); Sung-woo Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1091 days.

This patent is subject to a terminal disclaimer.

(21) Appl. No.: 12/264,090

(22) Filed: Nov. 3, 2008

(65) Prior Publication Data

US 2009/0103663 A1 Apr. 23, 2009

Related U.S. Application Data

(63) Continuation of application No. 11/121,065, filed on May 4, 2005, now Pat. No. 8,619,900.

(60) Provisional application No. 60/568,254, filed on May 6, 2004.

(30) Foreign Application Priority Data

Dec. 6, 2004 (KR) .................................. 2004-101940

(51) Int. Cl.
H04L 27/00 (2006.01)
H04L 27/28 (2006.01)

(52) U.S. Cl.
USPC .......................................... 375/260; 375/316

(58) Field of Classification Search
USPC ............................. 375/25–261, 265, 295, 316
See application file for complete search history.

(56) References Cited

U.S. PATENT DOCUMENTS 5,233,349 A 8/1993 Moulsley
6,078,578 A * 6/2000 Matsumoto ................... 370/350

(Continued)

FOREIGN PATENT DOCUMENTS

JP 2003-47007 2/2003
KR 2001-111667 12/2001

OTHER PUBLICATIONS

Communication, dated Jul. 26, 2012, issued by the Canadian Intellectual Property Office in counterpart Canadian Application No. 2,565,740.

(Continued)

Primary Examiner — Kevin M Burd
(74) Attorney, Agent, or Firm — Sughrue Mion, PLLC

(57) ABSTRACT

A digital broadcast transmitter comprising: a randomizer to receive a data stream of which stuff bytes are inserted into a specified position and to randomize the received data stream; a stuff-byte exchange unit to generate known data having a predefined pattern and to insert the known data into the specified position of the data stream into which the stuff bytes are inserted; an encoder to encode the data stream output from the stuff-byte exchange unit for an error correction; and a modulator and RF converter to modulate the encoded data stream, RF-convert the modulated data stream and transmit the RF-converted data.

18 Claims, 13 Drawing Sheets

(56) References Cited

U.S. PATENT DOCUMENTS

| | | | |
|---|---|---|---|
| 6,608,870 B1 * | 8/2003 | Fimoff | 375/270 |
| 6,810,084 B1 | 10/2004 | Jun et al. | |
| 7,590,187 B2 * | 9/2009 | Jeong et al. | 375/265 |
| 7,593,474 B2 * | 9/2009 | Jeong et al. | 375/265 |
| 7,773,684 B2 * | 8/2010 | Jeong et al. | 375/265 |
| 2001/0034867 A1 | 10/2001 | Jaffe et al. | |
| 2001/0050926 A1 * | 12/2001 | Kumar | 370/529 |
| 2002/0126222 A1 | 9/2002 | Choi et al. | |
| 2002/0159520 A1 | 10/2002 | Choi et al. | |
| 2002/0181581 A1 | 12/2002 | Blrru et al. | |
| 2003/0099303 A1 | 5/2003 | Birru et al. | |
| 2004/0148642 A1 | 7/2004 | Park et al. | |

OTHER PUBLICATIONS

Communication, dated Sep. 13, 2012, issued by the State Intellectual Property Office of P.R. China in counterpart Chinese Application No. 200910167090.2.

Search Report issued on Aug. 24, 2005 in International Patent Application No. PCT/KR/001314.

ATSC Standard: Digital Television Standard (A/53), Jul. 2005.

Office Action issued in Korean Patent Application No. 2004-101940 on May 19, 2006.

U.S. Appl. No. 11/121,065, filed May 4, 2005, Hae-joo Jeong et al., Samsung Electronics Co., Ltd.

U.S. Appl. No. 12/264,061, filed Nov. 3, 2008, Hae-joo Jeong et al., Samsung Electronics Co., Ltd.

U.S. Appl. No. 12/264,074, filed Nov. 3, 2008, Hae-joo Jeong et al., Samsung Electronics Co., Ltd.

U.S. Appl. No. 12/264,103, filed Nov. 3, 2008, Hae-joo Jeong et al., Samsung Electronics Co., Ltd.

U.S. Appl. No. 12/264,113, filed Nov. 3, 2008, Hae-joo Jeong et al., Samsung Electronics Co., Ltd.

U.S. Appl. No. 12/264,120, filed Nov. 3, 2008, Hae-joo Jeong et al., Samsung Electronics Co., Ltd.

Communication from the Canadian Office dated Apr. 16, 2012 in a counterpart application No. 2677963.

Communication from the Canadian Office dated Apr. 16, 2012 in a counterpart application No. 2677967.

Communication, dated Nov. 12, 2013, issued by the Canadian Intellectual Property Office in counterpart Canadian Patent Application No. 2,677,963.

* cited by examiner

DIGITAL BROADCAST TRANSMISSION AND RECEIVING SYSTEM HAVING AN IMPROVED RECEIVING PERFORMANCE AND SIGNAL PROCESSING METHOD THEREOF

CROSS-REFERENCE TO RELATED APPLICATIONS

This application is a continuation of U.S. patent application Ser. No. 11/121,065 filed on May 4, 2005, which claims benefit from U.S. Provisional Application No. 60/568,254 filed on May 6, 2004, in the United States Patent and Trademark Office, and Korean Patent Application No. 2004-101940 filed on Dec. 6, 2004, in the Korean Intellectual Property Office, the entire contents of which are incorporated herein by reference in their entirety.

BACKGROUND OF THE INVENTION

1. Field of the Invention

The present general inventive concept relates to a digital broadcast transmitting and receiving system and a signal processing method thereof. More particularly, the present general inventive concept relates to a digital broadcast transmitting and receiving system and a signal processing method thereof, which can improve receiving performance of the system by inserting a known sequence into a VSB (Vestigial Side Band) data stream and transmitting the data stream with the inserted known sequence.

2. Description of the Related Art

An ATSC (Advanced Television Systems Committee) VSB system that is an American-type digital terrestrial broadcasting system, is a signal carrier type broadcasting system, and uses a field sync signal in the unit of 312 segments.

FIG. 1 is a block diagram of a transmitter and receiver of an ATSC DTV standard as a general American-type digital terrestrial broadcasting system.

The digital broadcast transmitter of FIG. 1 includes a randomizer 110 for randomizing an MPEG-2 (Moving Picture Experts Group) transport stream (TS), an RS (Reed-Solomon) encoder 120 for adding RS parity bytes to the transport stream in order to correct bit errors occurring due to the channel characteristic in a transport process, an interleaver 130 for interleaving the RS-encoded data according to a specified pattern, and a trellis encoder 140 for mapping the interleaved data onto 8-level symbols by performing a trellis encoding of the interleaved data at the rate of ⅔. The digital broadcast transmitter performs an error correction coding of the MPEG-2 transport stream.

The digital broadcast transmitter further includes a multiplexer 150 for inserting a segment sync signal and a field sync signal into the error-correction-coded data, and a modulator and RF converter 160 for inserting a pilot tone into the data symbols into which the segment sync signal and the field sync signal are inserted by inserting a specified DC value into the data symbols, performing a VSB modulation of the data symbols by pulse-shaping the data symbols, and up-converting the modulated data symbols into an RF channel band signal to transmit the RF channel band signal.

Accordingly, the digital broadcast transmitter randomizes the MPEG-2 transport stream, outer-codes the randomized data through the RS encoder 120 that is an outer coder, and distributes the coded data through the interleaver 130. Also, the digital broadcast transmitter inner-codes the interleaved data in the unit of 12 symbols through the trellis encoder 140, performs the mapping of the inner-coded data onto the 8-level symbols, inserts the field sync signal and the segment sync signal into the coded data, performs the VSB modulation of the data, and then up-converts the modulated data into the RF signal to output the RF signal.

The digital broadcast receiver of FIG. 1 includes a tuner 210 for down-converting an RF signal received through a channel into a baseband signal, a demodulator 220 for performing a sync detection and demodulation of the converted baseband signal, an equalizer 230 for compensating for a channel distortion of the demodulated signal occurring due to a multi-path, a trellis decoder 240 for correcting errors of the equalized signal and decoding the equalized signal to symbol data, a deinterleaver 250 for rearranging the data distributed by the interleaver 130 of the digital broadcast transmitter, an RS decoder 260 for correcting errors, and derandomizer 270 for de-randomizing the data corrected through the RS decoder 260 and outputting an MPEG-2 transport stream.

Accordingly, the digital broadcast receiver of FIG. 1 down-converts the RF signal into the baseband signal, demodulates and equalizes the converted signal, and channel-decodes the demodulated signal to restore to the original signal.

FIG. 2 illustrates a VSB data frame for use in the American type digital broadcasting (8-VSB) system, into which a segment sync signal and a field sync signal are inserted. As shown in FIG. 2, one frame consists of two fields. One field is composed of one field sync segment that is the first segment and 312 data segments. The other segment in the VSB data frame corresponds to one MPEG-2 packet, and is composed of a segment sync signal of four symbols and 828 data symbols.

In FIG. 2, the segment sync signal and the field sync signal are used for the synchronization and equalization in the digital broadcast receiver. That is, the field sync signal and the segment sync signal refer to known data between the digital broadcast transmitter and receiver, which is used as a reference signal when the equalization is performed in the receiver side.

As shown in FIG. 1, the VSB system of the American type digital terrestrial broadcasting system is a single carrier system, and thus has a drawback in that it is weak in a multi-path fading channel environment having the Doppler effect. Accordingly, the performance of the receiver is greatly influenced by the performance of the equalizer for removing the multi-path.

However, according to the existing transport frame as shown in FIG. 2, since the field sync signal that is the reference signal of the equalizer appears once for every 313 segments, its frequency is quite low with respect to one frame signal and causes the performance of equalization to deteriorate.

Specifically, it is not easy for the existing equalizer to estimate the channel using a small amount of data as above and to equalize the received signal by removing the multi-path. Accordingly, the conventional digital broadcast receiver has disadvantages that its receiving performance deteriorates in an inferior channel environment, and especially in a Doppler facing channel environment.

SUMMARY OF THE INVENTION

The present general inventive concept provides a digital broadcast transmitting and receiving system and a signal processing method thereof, which can improve the receiving performance of the system by generating and transmitting a transport signal with known data added thereto in a transmitter side and by detecting the transport signal in a receiver side.

Additional aspects and advantages of the present general inventive concept will be set forth in part in the description which follows and, in part, will be obvious from the description, or may be learned by practice of the general inventive concept.

The foregoing and other aspects of the present general inventive concept are substantially realized by providing a digital broadcast transmitter which comprises a randomizer to receive a data stream of which stuff bytes are inserted into a specified position and randomizing the received data stream, a stuff-byte exchange unit to generate known data having a predefined pattern and insert the known data into the specified position of the data stream into which the stuff bytes are inserted, an encoder to encode the data stream output from the stuff-byte exchange unit for an error correction, and a modulator and RF converter to modulate the encoded data stream, RF-convert the modulated data stream and transmit the RF-converted data.

The data stream may include information about the specified position into which the stuff bytes are inserted.

The information may be inserted into a position of the data stream preceding the position into which the stuff bytes are inserted, and may include information about a length of the stuff bytes.

The digital broadcast transmitter may further include a control signal generating unit to generate a control signal to control the stuff-byte exchange unit to insert the known data into the position according to the information.

The encoder may comprise a first RS (Reed-Solomon) encoder to add a parity of specified bytes to the data in order to correct errors occurring due to channels, an interleaver to interleave the data to which the parity is added in a specified pattern, and a trellis encoder to perform a trellis encoding of the interleaved data.

The trellis encoder may have a memory device for a trellis encoding operation, and can perform a trellis encoding by initializing the memory device from the position into which the known data is inserted.

The encoder may further include a packet buffer to receive and temporarily store the data stream from the first RS encoder.

The packet buffer may receive from the trellis encoder and temporarily store the known data encoded according to the initialization of the memory device.

The encoder may further include a second RS encoder to generate and output a changed parity by performing an RS encoding of the encoded known data input from the packet buffer to the trellis encoder so as to replace the parity added by the first RS encoder by the changed parity.

The interleaver can output the known data inserted into the same position of a plurality of different data streams output from the first RS encoder as a successive data stream.

The modulator and RF converter can modulate the data by a vestigial side band (VSB) modulation method.

The foregoing and other aspects of the present general inventive concept are also substantially realized by providing a signal processing method of a digital broadcast transmission, which comprises receiving a data stream of which stuff bytes are inserted into a specified position and randomizing the received data stream, generating a data stream having a specified known data and inserting the known data into the position of the randomized data stream into which the stuff bytes are inserted, error-correction-encoding the data stream output from a stuff-byte exchange unit, and modulating the error-correction-encoded data stream, RF-converting the modulated data stream and transmitting the RF-converted data stream.

Preferably, the encoding operation may include a first RS (Reed-Solomon) encoding operation of adding a parity of specified bytes to the data in order to correct errors occurring due to channels, an interleaving operation of interleaving the data to which the parity is added in a specified pattern, and a trellis encoding operation of performing a trellis encoding of the interleaved data.

The trellis encoding operation may perform a trellis encoding by initializing a specified memory device used for a trellis encoding operation in the position into which the known data is inserted.

The encoding operation may further include the operation of receiving and temporarily storing the data stream generated at the first RS encoding operation, and receiving and updating the known data encoded according to the initialization of the memory device.

The encoding operation may further include a second RS encoding operation of generating a changed parity by re-performing an RS encoding of the encoded known data, replacing the parity added at the first RS encoding operation by the changed parity, and performing a trellis encoding of the known data.

The modulating and RF-converting operation may modulate the data by a vestigial side band (VSB) modulation method.

The foregoing and other aspects of the present general inventive concept are also substantially realized by providing a digital broadcast receiver comprising a tuner to receive a signal from a digital broadcast transmitter and to convert the signal to a baseband signal, the signal that is encoded by inserting known data to a specified position with respect to a data stream to which stuff bytes are inserted at the specified position, a demodulator to demodulate the baseband signal, a known data detector to detect the known data from the demodulated signal, and an equalizer to equalize the demodulated signal using the detected known data.

The known data may comprise a sequence having a predefined pattern.

The known data detector may comprise a symbol number detector to detect information about the specified position into which the known data is inserted from the received signal, a segment generator to generate a data frame that includes at least one segment to indicate the position by an identification sign, an error correction encoder to perform an error correction encoding of the data frame, and a known symbol output unit to insert the known data into the position of the encoded data frame indicated by the identification sign.

The known data detector can output the detected known data to the demodulator, and the demodulator can perform the demodulation using the known data.

The foregoing and other aspects of the present general inventive concept are also substantially realized by providing a signal processing method of a digital broadcast reception, which comprises receiving a signal from a digital broadcast transmitter and converting the signal to a baseband signal, the signal being encoded by inserting known data to a specified position with respect to a data stream to which stuff bytes are inserted at the specified position, demodulating the baseband signal, detecting the known data from the demodulated signal, and equalizing the demodulated signal using the detected known data.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE EMBODIMENTS

Figure 1:
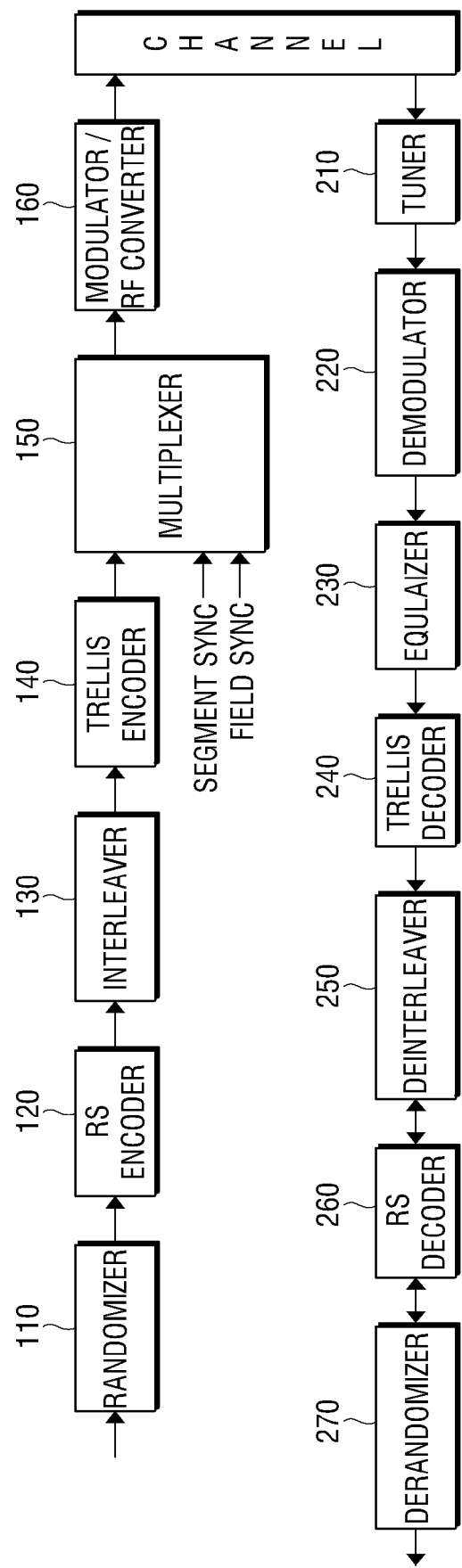
FIG. 1 is a block diagram of a transmitting and receiving system of a general American-type digital broadcasting (ATSC VSB) system.

Certain embodiments of the present general inventive concept will be described in greater detail with reference to the accompanying drawings.

In the following description, same drawing reference numerals are used for the same elements even in different drawings. The matters defined in the description such as a detailed construction and elements are nothing but the ones provided to assist in a comprehensive understanding of the general inventive concept. Thus, it is apparent that the present general inventive concept can be carried out without those defined matters. Also, well-known functions or constructions are not described in detail since they would obscure the general inventive concept in unnecessary detail.

Figure 3:
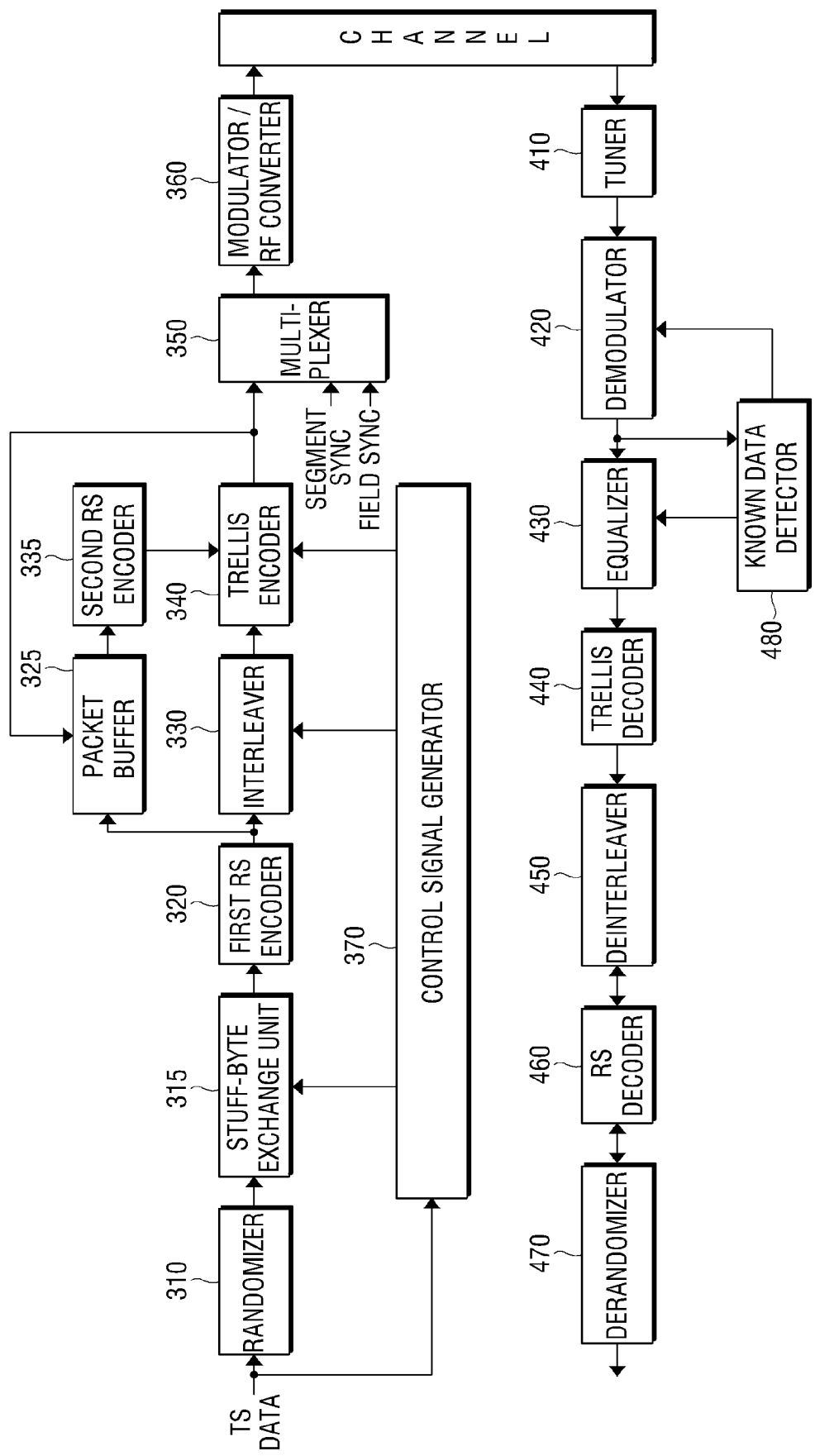
FIG. 3 is a block diagram of a digital broadcast transmitting and receiving system according to an embodiment of the present general inventive concept.

FIG. 3 is a block diagram of the construction of a digital broadcast transmitting and receiving system according to an embodiment of the present general inventive concept.

Referring to FIG. 3, the digital broadcast transmitter includes a randomizer 310, a stuff-byte exchange unit 315, a first RS encoder 320, a packet buffer 325, an interleaver 330, a second RS encoder 335, a trellis encoder 340, a multiplexer 350, a modulator and RF converter 360, and a control signal generator 370.

The randomizer 310 randomizes an input MPEG-2 transport stream data in order to heighten the utility of an allocated channel space. The data input to the randomizer 310 has the data format formed by inserting stuff bytes, which has a specified length of bytes but does not include payload data, into a specified position of the input transport stream data, which will be explained in detail.

The stuff-byte exchange unit 315 generates a specified sequence (hereinafter referred to as "known data") having a specified pattern prearranged between a transmitter side and a receiver side. The stuff-byte exchange unit 315 inserts the generated known data into a stuff byte position of the randomized data in replacement of the stuff bytes. The known data can easily be detected from payload data to be transmitted, and thus is used for synchronization and equalization operations in the receiver side.

The first RS encoder 320 adds a parity of specified bytes to the randomized data (also referred to as packet data) into which the known data is inserted by the stuff-byte exchange unit 315 in replacement of the stuff bytes in order to correct errors occurring due to channels.

The interleaver 330 interleaves the packet data to which the parity output from the first RS encoder 320 is added in a specified pattern.

The trellis encoder 340 converts the data output from the interleaver 330 into data symbols, and performs symbol mapping of the data symbols through a trellis encoding at the rate of ⅔. The trellis encoder 340 initializes the value temporarily stored in its own memory device to a specific value at the start point of the known data. For example, the value stored in the memory device can be initialized to a "00."

The packet buffer 325 extracts and temporarily stores the known data from the packet data output from the first RS encoder 320 from the start point of the known data. If the known data is trellis-encoded in the trellis encoder 340 according to the initialization of the memory device, the packet buffer 325 receives the known data changed according to the initialization of the memory device from the trellis encoder 340, temporarily stores the changed known data in replacement of the previous known data temporarily stored, and then inputs the changed known data to the second RS encoder 335 for a parity regeneration.

The second RS encoder 335 replaces the original parity with the newly generated parity by receiving the known data changed according to the initialization of the memory device, and regenerating and inputting the newly generated parity according to the changed data to the trellis encoder 340. Accordingly, the packet data output from the trellis encoder 340 to the multiplexer 350 represents a data format having the known data changed according to the initialization of the memory device of the trellis encoder 340 and the parity added thereto according to the RS encoding.

Figure 2:
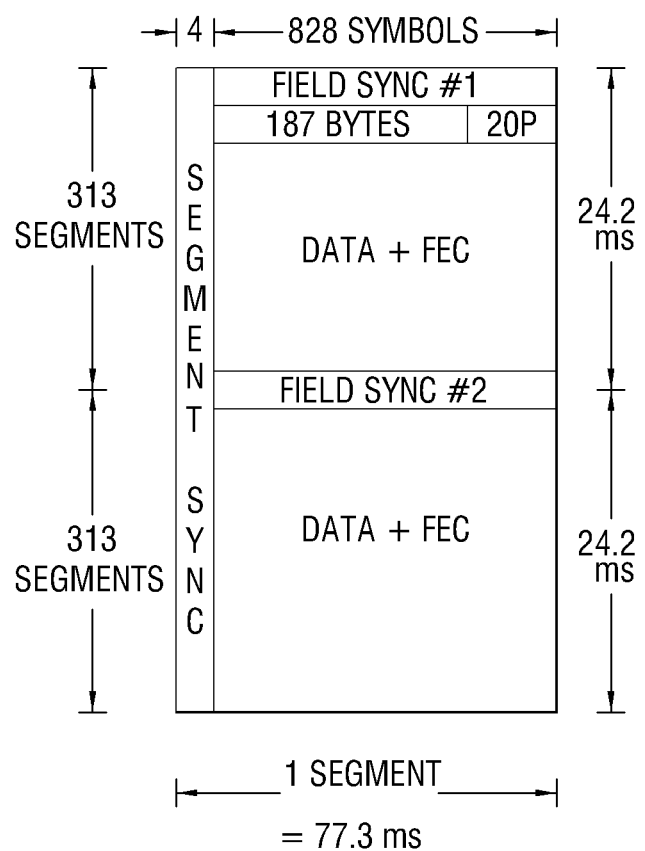
FIG. 2 is a the structure of an ATSC VSB data frame.

The multiplexer 350 inserts a segment sync signal into the data that has been converted into symbols by the trellis encoder 340 in the unit of a segment as shown in the data format of FIG. 2, and inserts a field sync signal into the data in the unit of a field. In addition, the second multiplexer 350 inserts a pilot signal into an edge portion of a low frequency band of a frequency spectrum by adding a specified DC value to the data signal of a specified level.

The modulator and RF converter 360 performs a VSB modulation of the signal into which the pilot signal has been inserted by performing a pulse shaping of the signal and amplitude-modulating the signal with an intermediate frequency (IF) carrier, RF-converts and amplifies the modulated signal, and transmits the converted signal through an allocated channel.

The control signal generator 370 receives the transport stream to which the stuff bytes are added, detects information about the position to which the stuff bytes are added from the transport stream, and generates and outputs the control signal to recognize the start position and the end position of the known data to the stuff-byte exchange unit 315, the interleaver 320 and the trellis encoder 340.

The digital broadcast receiver of FIG. 3 includes a tuner 410, a demodulator 420, an equalizer 430, a trellis decoder 440, a deinterleaver 450, an RS decoder 460, a derandomizer 470, and a known data detector 480. The digital broadcast receiver operates in a reverse process with respect to the digital broadcast transmitter of FIG. 3.

The tuner 410 selects the received signal and converts the selected received signal into a baseband signal.

The demodulator 420 detects the sync signals from the baseband signal and demodulates the baseband signal according to a pilot signal and the sync signals inserted into the baseband signal. The equalizer 430 removes a mutual interference between the received data symbols (i.e., from the trellis encoder 340) by compensating for channel distortion of the demodulated signal due to the multi-path of the channel.

The trellis decoder 440 performs an error correction of the data symbols, decodes the error-corrected data symbols, and outputs decoded symbol data. The deinterleaver 450 rearranges the decoded data, which was distributed by the interleaver 330 of the digital broadcast transmitter.

The RS decoder 460 corrects errors of the deinterleaved data, and the derandomizer 470 de-randomizes the data corrected through the RS decoder 460 so that the data of the MPEG-2 transport stream is restored.

The known data detector 480 detects the position of the known data from the demodulated data, and outputs the known data generated by generating and encoding a segment frame for the demodulator's sync detection and the equalizer's compensation for the channel distortion.

Figure 12:
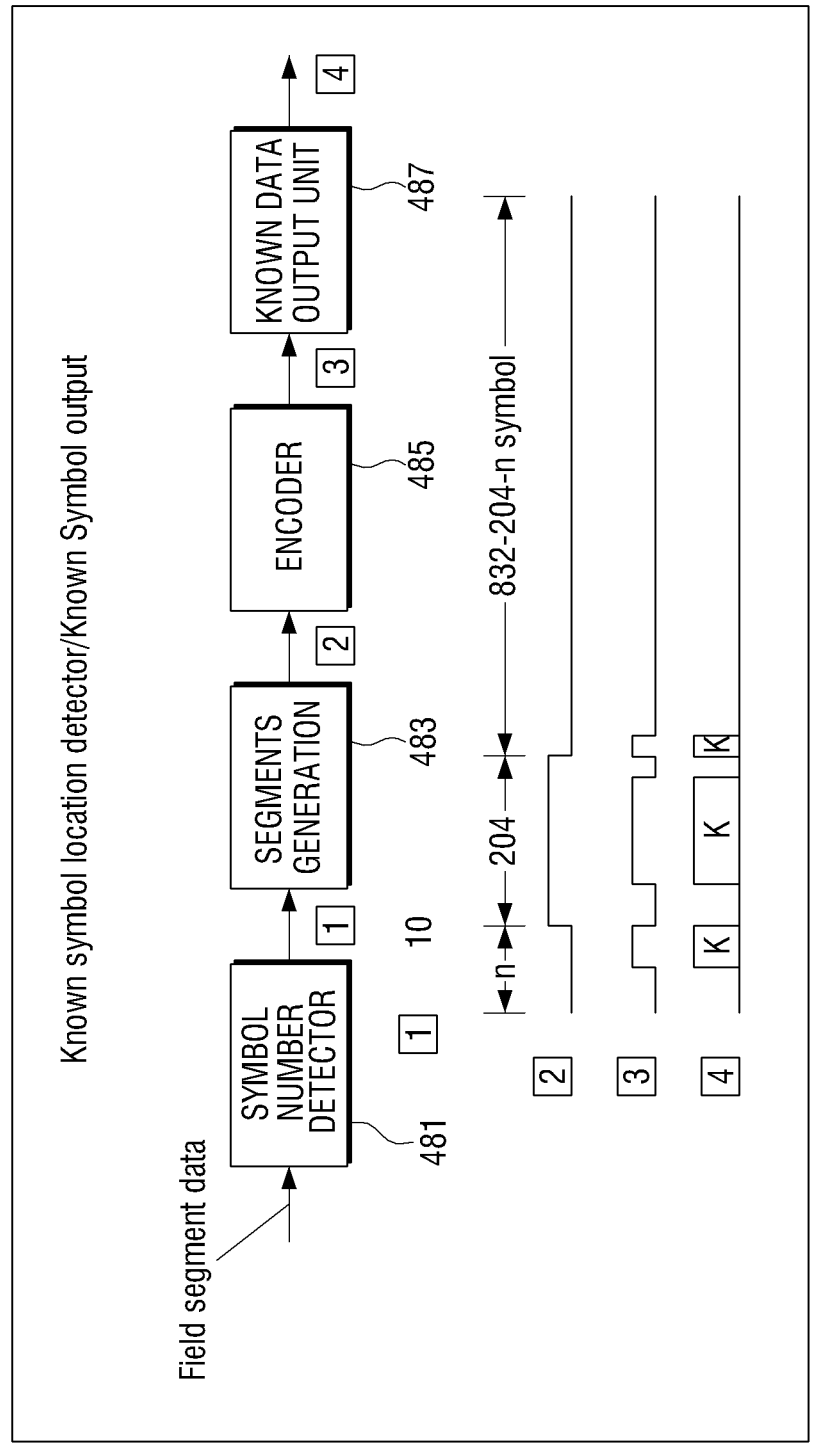
FIG. 12 is the construction of a known data detector of a digital broadcast receiver according to an embodiment of the presentgeneral inventive concept.

FIG. 12 illustrates the construction of the known data detector 480 of the digital broadcast receiver according to an embodiment of the present general inventive concept.

Referring to FIG. 12, the known data detector 480 includes a symbol number detector 481, a segment generator 483, an encoder 485 and a known data output unit 487.

The symbol number detector 481 extracts the information about the position of the known data from control information bits that include information about the length of an adaptation field of a demodulated data header part. The information about the position of the known data includes the information about the length of the known data. Because the position of the known data is predetermined, the position and the number of known symbols according to the encoding of the known data can be obtained from the length of the known data.

The segment generator 483 generates at least one segment to indicate the corresponding position according to the position and the number of the known symbols by marking an identification sign that corresponds to the number of symbols, and generates the MPEG-2 transport stream that includes such a segment.

The encoder 485 encodes the transport frame generated by the segment generator 483 in the same manner as that performed by the transmitter side.

Accordingly, the known data output unit 487 inserts the predefined known data into the position of the transport frame encoded by the encoder 485 that corresponds to the known symbols obtained according to the identification sign.

Figure 4:
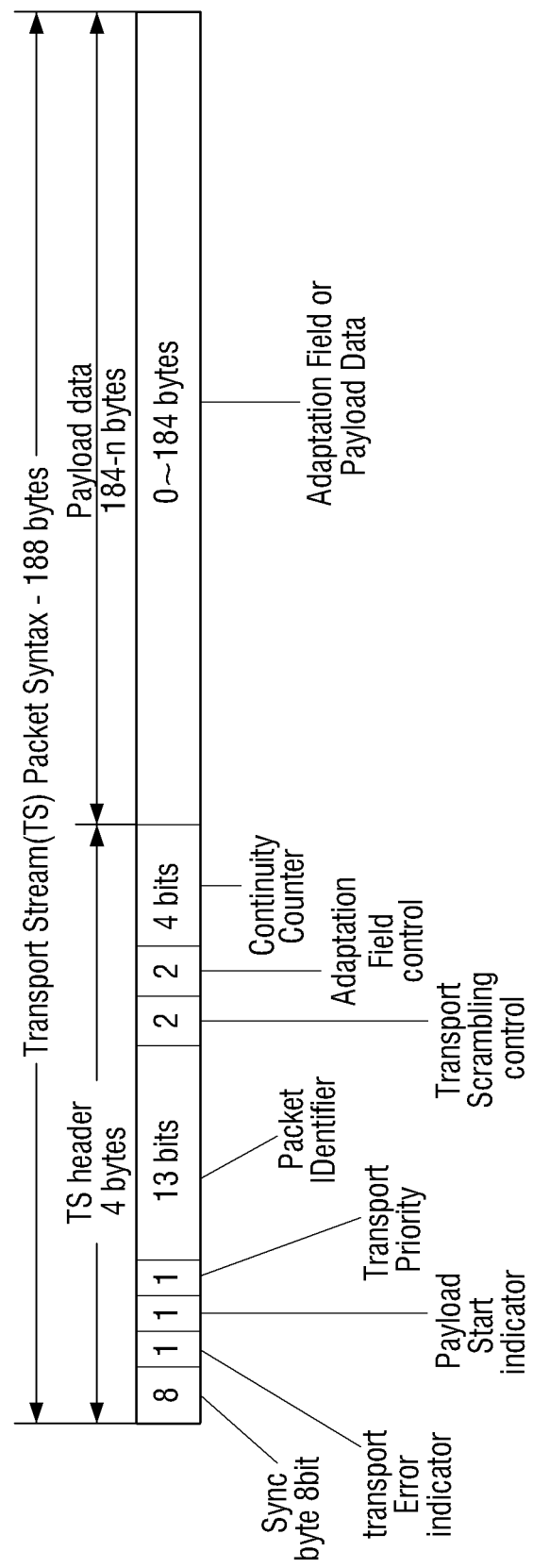
FIG. 4 is a structure of a general MPEG-2 transport stream packet.
Figure 5:
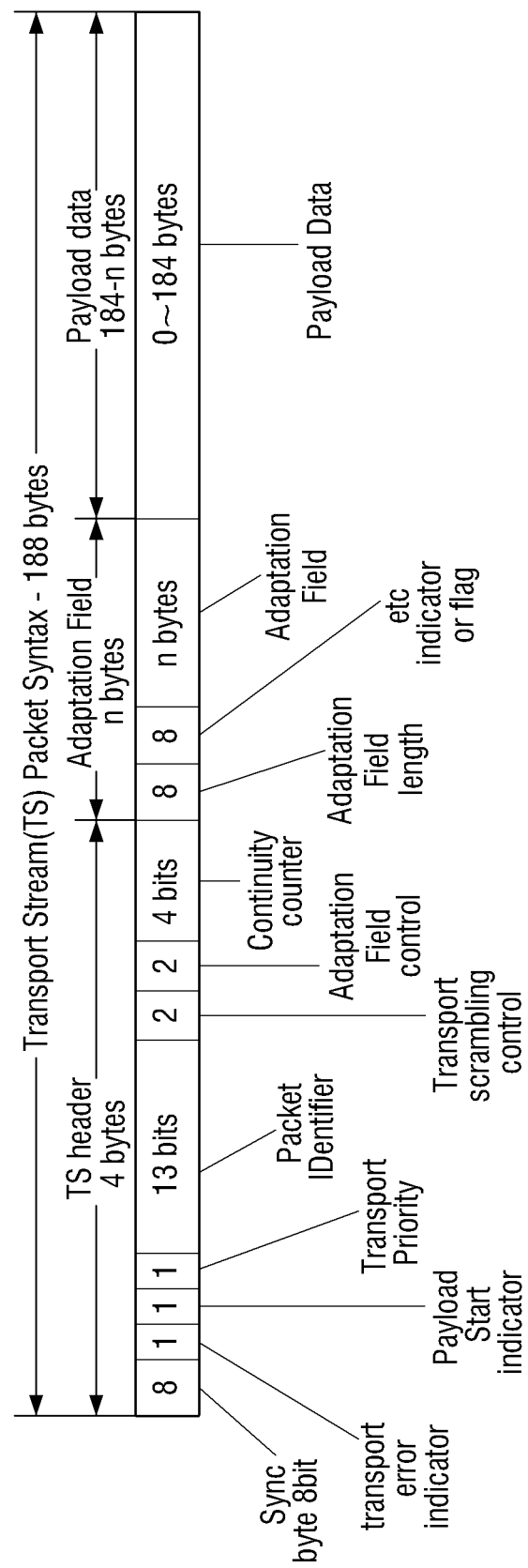
FIG. 5 is a structure of an MPEG-2 transport stream packet that includes an adaptation field to which stuff bytes are added according to an embodiment of the presentgeneral inventive concept.

FIG. 4 illustrates the structure of a general MPEG-2 transport stream packet, and FIG. 5 illustrates the structure of an MPEG-2 transport stream packet that includes an adaptation field to which stuff bytes are added according to an embodiment of the present general inventive concept.

Referring to FIG. 4, the general MPEG-2 transport stream is composed of a TS header part of 4 bytes and an adaptation field or payload data of 184 bytes.

Referring to FIG. 5, according to the MPEG-2 transport stream of the present general inventive concept, an adaptation field of "n" bytes is located after the header part of 4 bytes, and payload data of "184-n" bytes is located after the adaptation field. The fifth and sixth bytes, that is, the first two bytes, of the adaptation field constitute control information bits that include length information of the adaptation field, and stuff bytes according to an embodiment of the present general inventive concept are inserted into the seventh byte of the transport stream, that is, the third byte of the adaptation field. Accordingly, the transmission rate may be reduced somewhat due to the reduction of the payload data as long as the length of the adaptation field into which the stuff bytes are inserted. However, the length of the adaptation field is changeable, and thus it can be adjusted in order to improve the transmission performance.

Figure 13A:
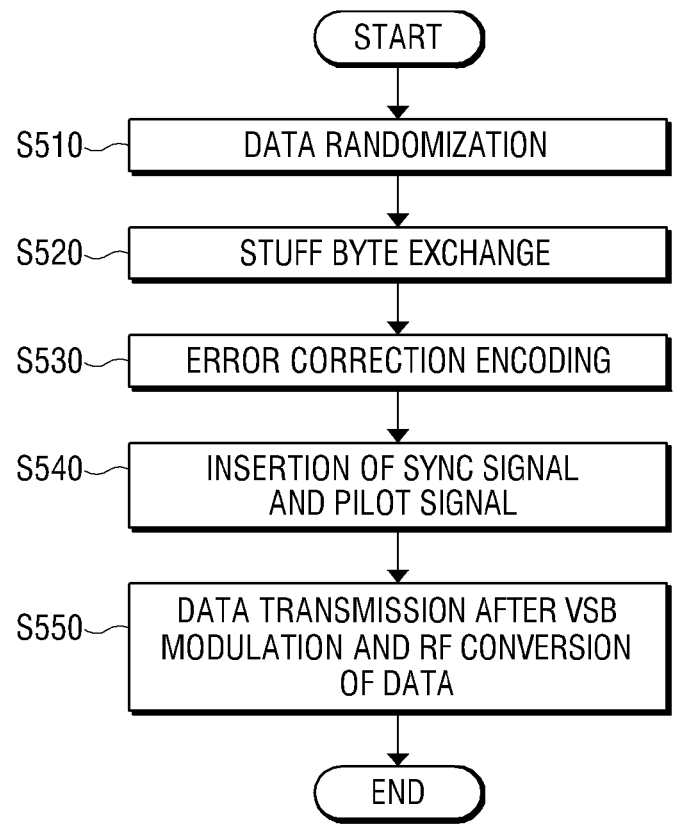
FIGS. 13A and 13B are flowcharts illustrating the operation of a digital broadcast transmitter according to an embodiment of the presentgeneral inventive concept.

FIGS. 6 to 11 illustrate data formats that are changed according to the data processing of an MPEG-2 transport stream packet in a digital broadcast transmitter according to an embodiment of the present general inventive concept. FIG. 13A is a flowchart illustrating the operation of the digital broadcast transmitter according to an embodiment of the present general inventive concept.

Hereinafter, the operation of the digital broadcast transmitter according to an embodiment of the present general inventive concept will be explained with reference to the accompanying drawings.

The randomizer 310 randomizes an input MPEG-2 transport stream including stuff bytes of a specified length of bytes (operation S510). The data input to the randomizer 310 has the data format as shown in FIG. 6.

Figure 6:
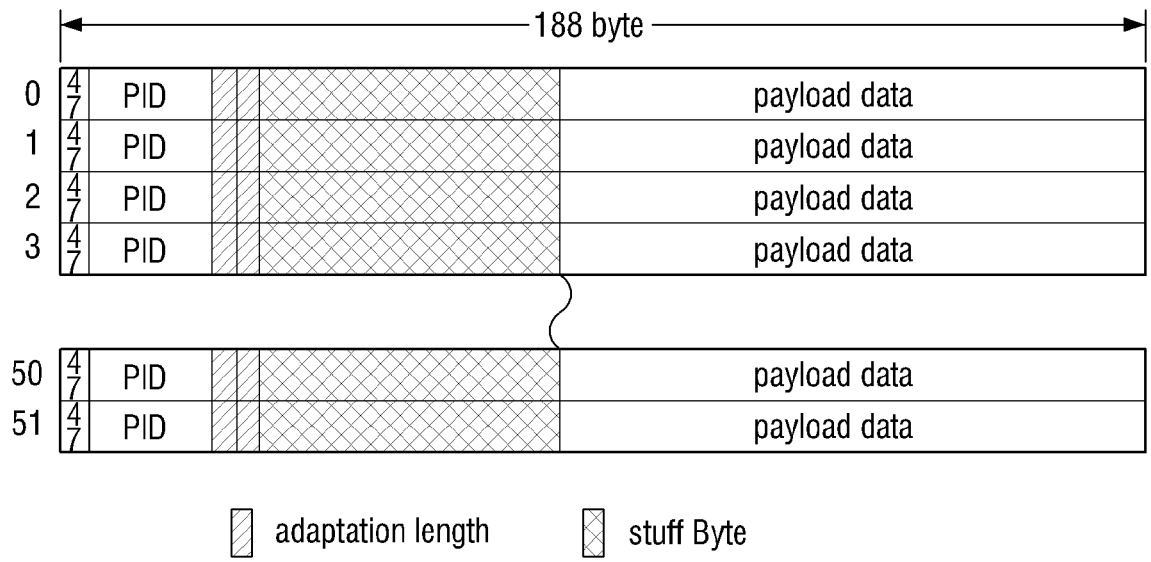
FIG. 6 is a data format of an MPEG-2 transport stream packet input to a randomizer according to an embodiment of the presentgeneral inventive concept.

Referring to FIG. 6, the MPEG-2 packet data includes a header part composed of the first byte that represents a sync signal and a PID (Packet Identifier) of three bytes, two-byte control information bits that include information about the position of the stuff bytes, and stuff bytes composed of a specified length of bytes. Other bytes of the data refer to the payload data to be transmitted.

Specifically, the information about the position of the stuff bytes is inserted into the first two control information bits among the adaptation field after the three-byte PID of the header part, and the stuff bytes are inserted into the following adaptation field. Because the start position of the stuff bytes is fixed, the information about the position of the bytes is expressed as the information about the length of the stuff bytes.

Next, the stuff-byte exchange unit 315 generates the known data and inserts the known data into the position of the stuff bytes included in the data randomized by the randomizer 310 in replacement of the stuff bytes (operation S520). The known data is a specified sequence having a specified pattern known in advance between the transmitter side and the receiver side, and can easily be detected distinctively from the payload data.

The error correction encoding of the data into which the known data output from the stuff-byte exchange unit 315 is inserted is performed in order to correct the error occurring due to the channels (operation S530).

Figure 13B:
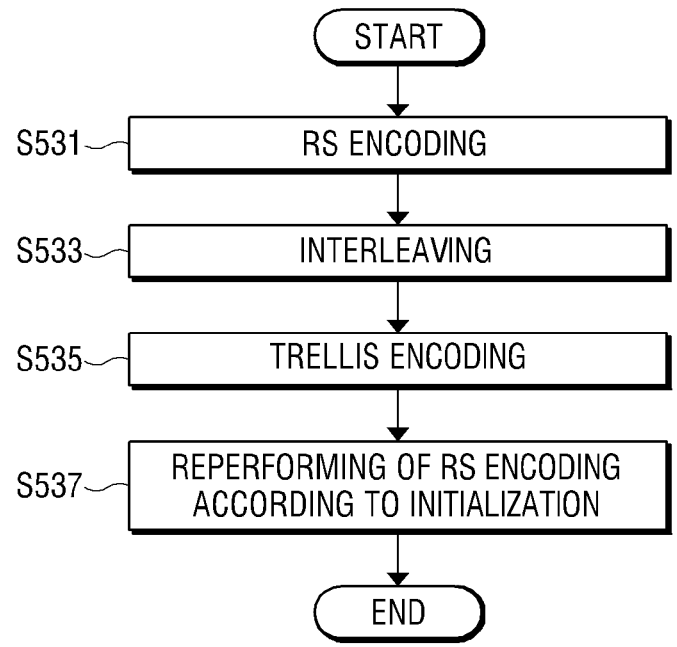

FIG. 13B is a flowchart illustrating the error correction encoding process.

Referring to FIG. 13B, for the error correction encoding, the first RS encoder 320 performs an RS encoding of the data to add a parity of specified bytes to the data (operation S531), the interleaver 330 performs a data interleaving of the RS-encoded data in a specified pattern (operation S533), and the trellis encoder 340 converts the interleaved data into data symbols and performs an 8-level symbol mapping of the converted data symbols through a trellis encoding at the rate of ⅔ (operation S535). Additionally, the second RS encoder 335 regenerates the parity by re-performing the RS encoding using the changed known data input to the packet buffer 325 (operation S537), and adds the regenerated parity to the data in replacement of the previous parity.

FIGS. 7 to 11 illustrate the structure of the packet data that is changed according to the error correction encoding process as described above.

Figure 7:
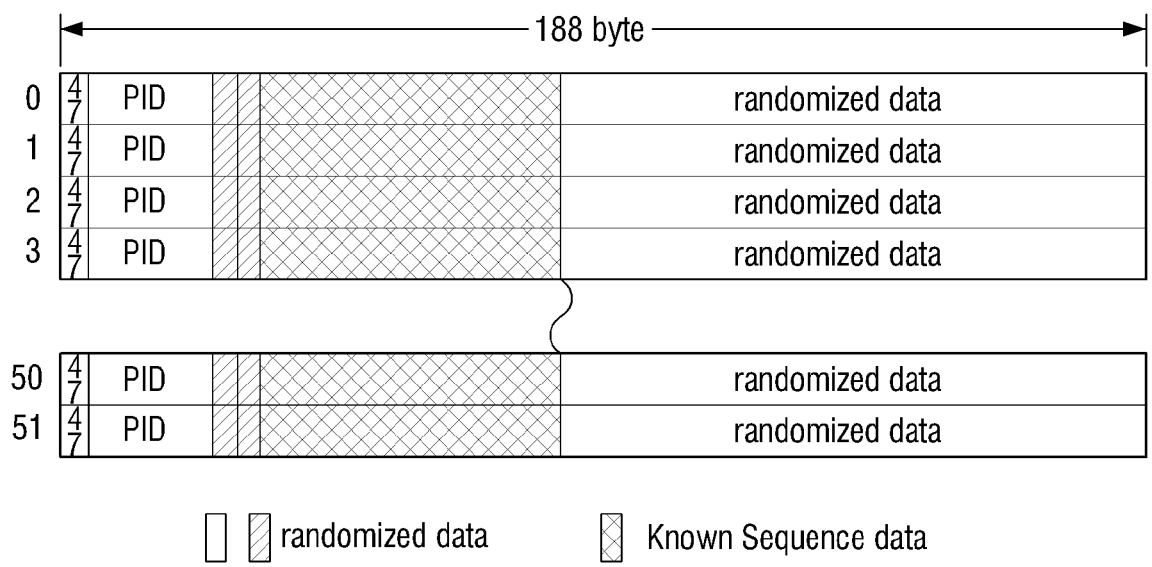
FIG. 7 is the data format of a randomized packet according to an embodiment of the presentgeneral inventive concept.

FIG. 7 illustrates a data stream which is randomized by the randomizer 310 and into which the known data is inserted by the stuff-byte exchange unit 315 in replacement of the stuff bytes. In FIG. 7, the length of the known data is not indicated, but it can be adjusted according to the channel environment, the amount, or importance of the data to be transmitted. As this known data is inserted after the randomization as the data known between the transmitter side and the receiver side, it can easily be detected in distinction from the randomized payload data and is used for the synchronization and equalization in the receiver side.

Figure 8:
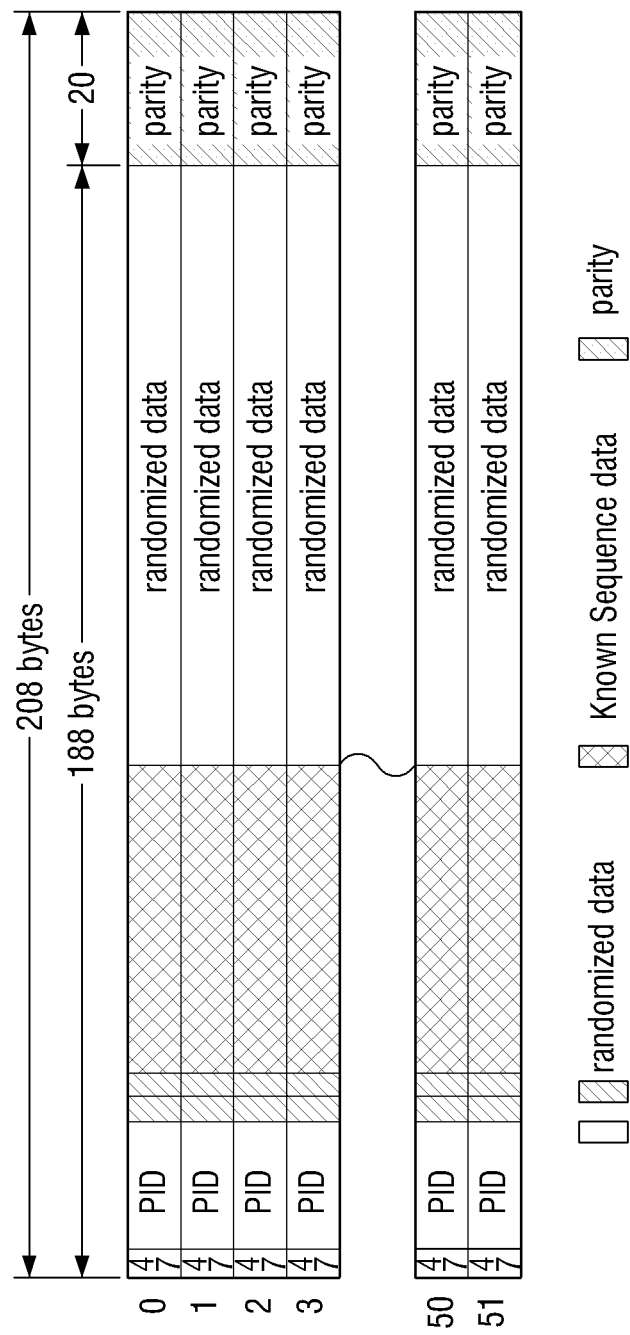
FIG. 8 is the data format of a packet RS-encoded according to an embodiment of the presentgeneral inventive concept.

FIG. 8 is a view of the data format output from the first RS encoder 320. The first RS encoder 320 adds a parity of specified bytes to the data output from the stuff-byte exchange unit 315 in order to correct the errors occurring due to the channels. Referring to FIG. 8, the RS parity of 20 bytes is added to an end part of the data stream of 188 bytes output from the first RS encoder 320.

Figure 9:
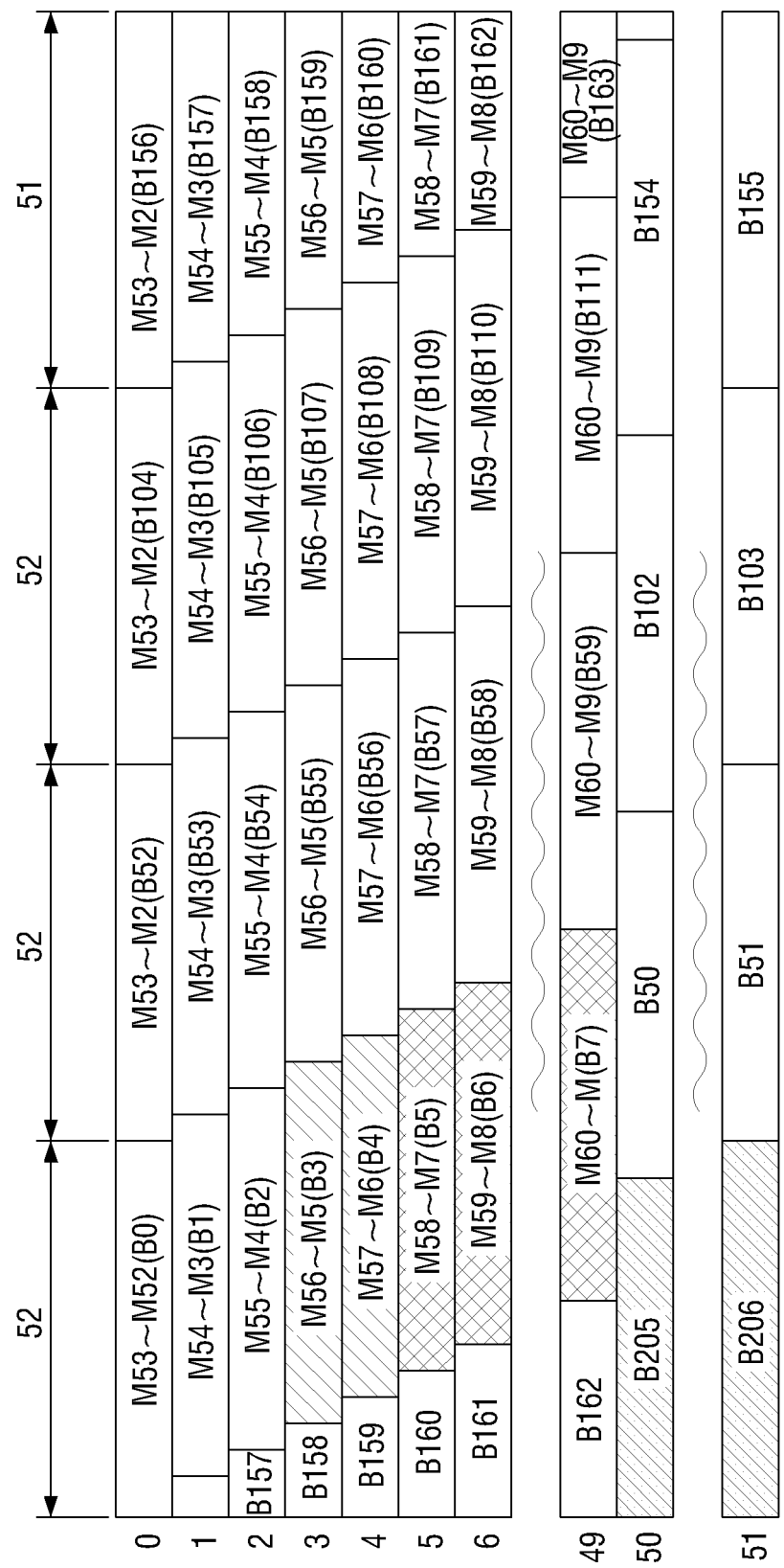
FIG. 9 is the data format of a packet interleaved according to an embodiment of the presentgeneral inventive concept.

FIG. 9 illustrates the data format output from the interleaver 330. The interleaver 330 distributes the data on the time axis so that the order of the data stream is distributed and the transport signal becomes strong against the interference.

According to this data distribution performed by the interleaver 330, the data bytes arranged at the same positions of the different segments in a vertical direction, as shown in FIG. 8, are rearranged as the successive data stream in a horizontal direction in the unit of 52 bytes.

The fourth and fifth bytes of the respective segments, which are composed of the control information bits including position information of the known data in FIG. 8, are changed to the data stream (M56.about.M5 (B3) and M57.about.M6 (B4)) successively in the horizontal direction as shown in FIG. 9 after the interleaving is performed. Accordingly, the control information bits are successively output.

The known data inserted into the fifth position of the respective segments are changed to the data stream (M58.about.M7 (B5), M59.about.M8 (B6), . . . , M60.about.M9 (B7)) successive in the horizontal direction, as shown in FIG. 9, after the interleaving is performed. Accordingly, the same bytes of the known data inserted into the respective segments are output as the successive stream in the unit of 52 bytes.

Figure 10:
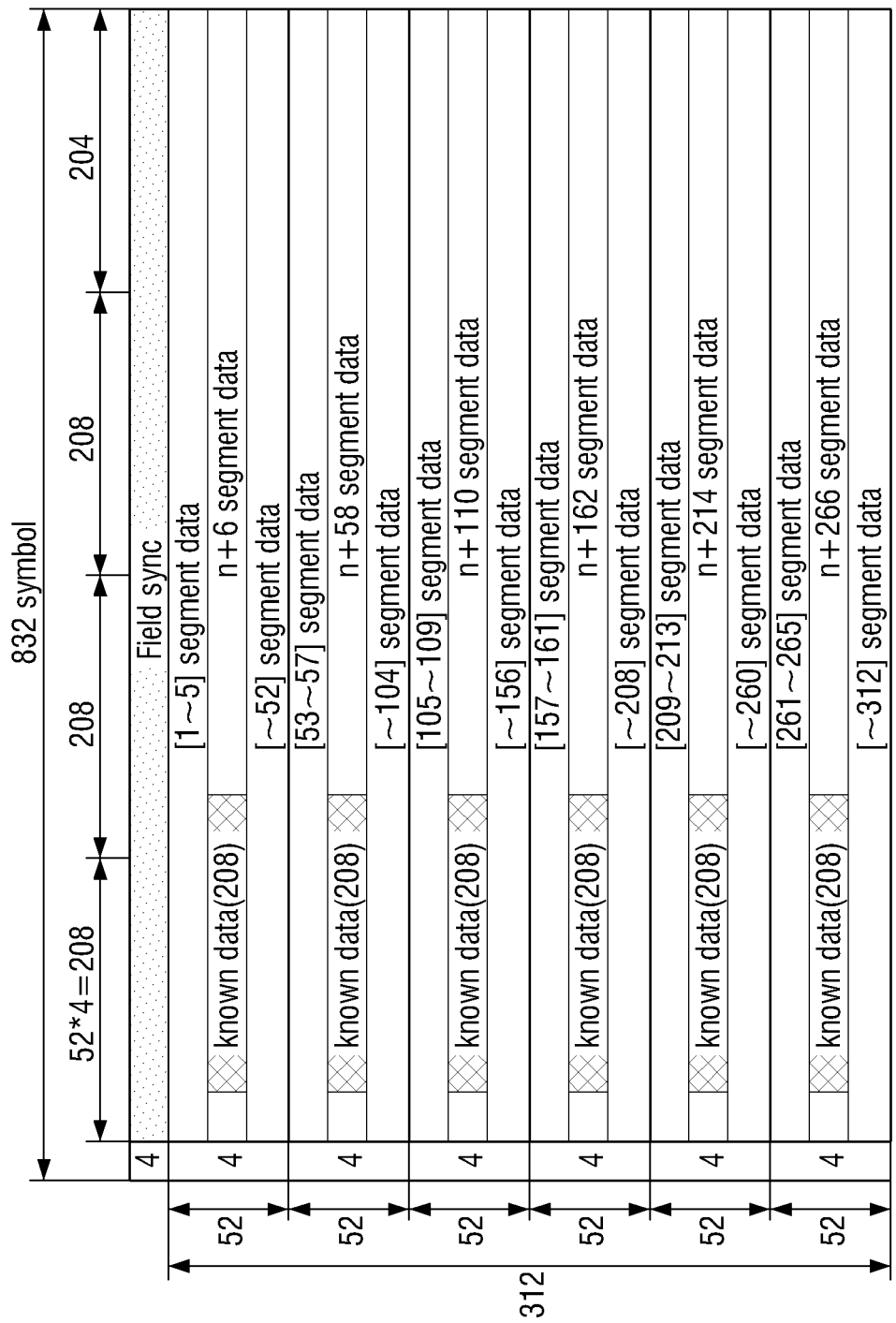
FIG. 10 is the data format of a packet trellis-encoded according to an embodiment of the presentgeneral inventive concept.

FIG. 10 illustrates the data format output from the trellis encoder 340 of FIG. 3. The trellis encoder 340 encodes each byte of the data output from the interleaver 330 to four 8-level symbols.

In FIG. 10, the known data appear for every 52 segments, and appear as successive symbols for a specified length, for example, 208 symbols. 6 known data sequences appear in one field. That is, 10*6=60 known data sequences including 10 stuff bytes appear in one field of the transport stream. Accordingly, the known data sequence can easily be detected from the payload data stream according to the length of the known data.

Figure 11:
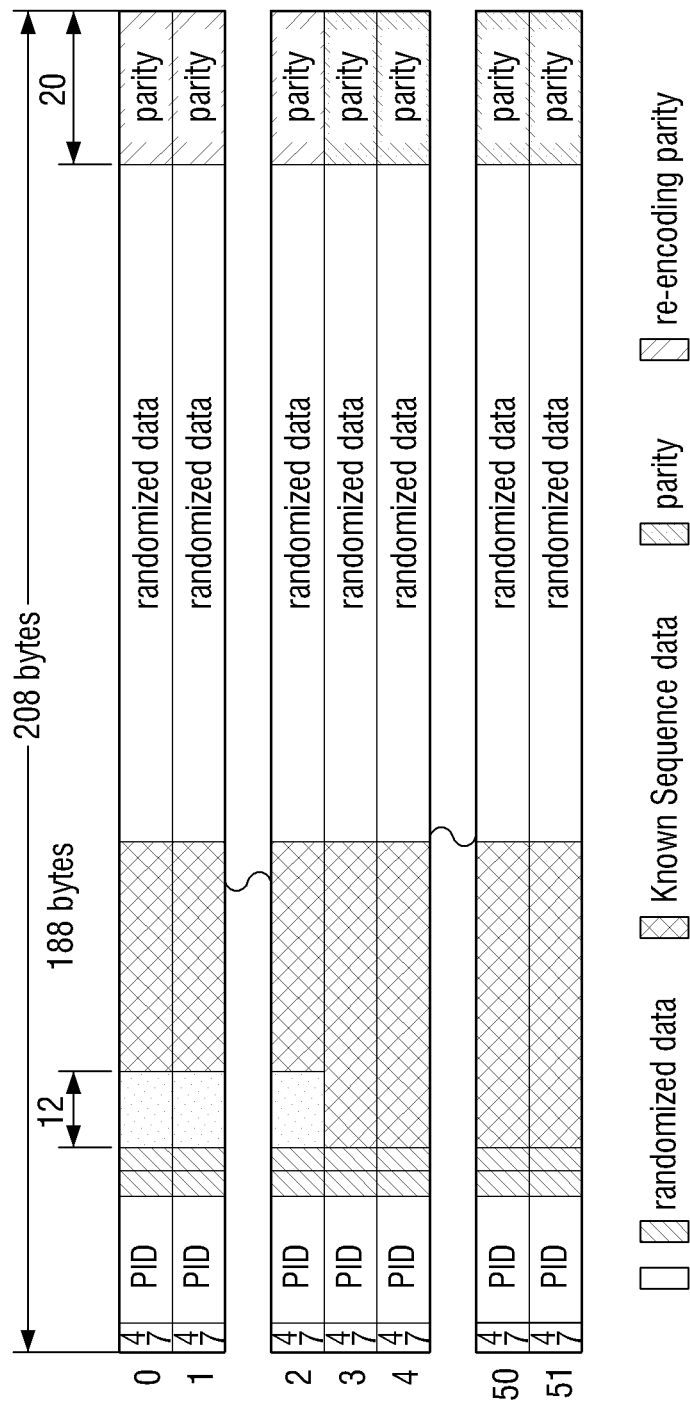
FIG. 11 is the data format of a packet to which a parity output from a second RS encoder is added according to an initialization of a trellis encoder.

FIG. 11 illustrates the process of changing the parity according to the operation of the second RS encoder 335. The packet buffer 325 extracts and temporarily stores the known data from the packet output from the first RS encoder 320 from the start point of the known data. If the known data is trellis-encoded in the trellis encoder 340 according to the initialization, the packet buffer 325 receives the known data changed according to the initialization from the trellis encoder 340, temporarily stores the changed known data by updating the previous known data temporarily stored, and inputs the changed known data to the second RS encoder 335 for the parity regeneration. The second RS encoder 335 generates the new parity (changed) by performing the RS encoding of the change known data, transmits the new generated parity to the trellis encoder 340 to replace the previous parity with the changed parity, and performs the trellis encoding of the data symbols to output the successive trellis-encoded symbols.

Accordingly, the packet data output from the trellis encoder 340 to the multiplexer 350 is the data obtained by trellis-encoding the known data changed according to the initialization of the memory device of the trellis encoder 340 and the packet data into which the parity is added according the RS encoding of the 8-level symbols.

Next, the multiplexer 350 inserts a segment sync signal into the symbol data in the unit of a segment of the symbol data, inserts a field sync signal into the symbol data in the unit of a field, and then inserts a pilot signal into the frequency spectrum (operation S540).

The modulator and RF converter 360 performs a VSB modulation of the signal into which the pilot signal is inserted by performing a pulse shaping of the signal and amplitude-modulating the signal with an intermediate frequency (IF) carrier, RF-converts and amplifies the modulated signal, and transmits the converted signal through an allocated channel (operation S550).

Figure 14A:
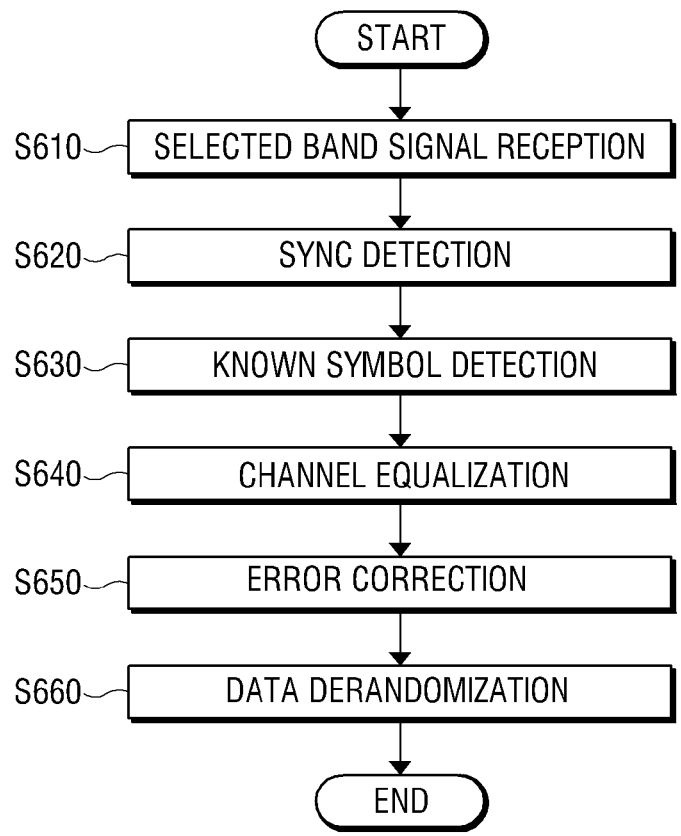
FIGS. 14A and 14B are flowcharts illustrating the operation of a digital broadcast receiver according to an embodiment of the presentgeneral inventive concept.
Figure 14B:
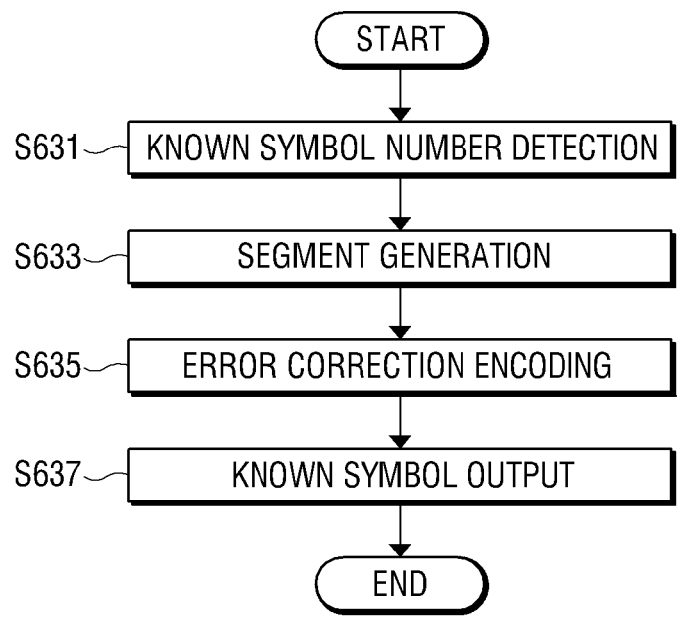

FIGS. 14A and 14B are flowcharts illustrating the operation of the digital broadcast receiver according to an embodiment of the present general inventive concept.

The tuner 410 selects the received signal and converts the selected signal into the baseband signal (operation S610).

The demodulator 420 detects the sync signals from the baseband signal and performs the demodulation of the baseband signal according to the pilot signal and the sync signals inserted into the baseband signal (operation S620).

The known data detector 480 detects the position of the known data from the equalized data and outputs the detected known data (operation S630).

The symbol number detector 481 extracts the information about the position of the known data that includes the length of the known data from control information bits that include information about the length of an adaptation field of a demodulated data header part (operation S631).

The symbol number detector 481 extracts the information about the position of the known data from control information bits that include information about the length of an adaptation field of a demodulated data header part. The information about the position of the known data includes the information about the length of the known data. As the position of the known data is predetermined, the position and the number of known symbols according to the encoding of the known data can be obtained from the length of the known data.

The segment generator 483 generates at least one segment to indicate the corresponding position according to the position and the number of the known symbols by marking an identification sign that corresponds to the number of symbols, and generates the MPEG-2 transport stream that includes such a segment (operation S633).

The encoder 485 performs the error correction encoding of the transport frame generated by the segment generator 483 in the same manner as that performed by the transmitter side (operation S635). The known data output unit 487 inserts the predefined known data into the position of the transport frame from the encoder 485 that has the identification sign to output the transport frame into which the known data is inserted to the equalizer 430 (operation S637).

The equalizer 430 performs the equalization by compensating for the channel distortion of the demodulated signal and removing the mutual interference among the received data symbols (operation S640). The equalizer 430 compensates for the channel distortion using the known data output from the known data detector 480. Also, the detected known data may be provided for the sync detection of the demodulator 420.

The synchronized and equalized data is error-corrected, and the error-corrected symbols are decoded. The decoded data is rearranged through the deinterleaving process, and then is error-corrected through the RS decoding (operation S650).

The error-corrected data is derandomized, and then output as the MPEG-2 transport stream data (operation S660).

As described above, according to an embodiment of the present general inventive concept, the receiving performance of the digital broadcast receiver, such as the synchronization and the equalization can be improved even in a inferior multipath channel by generating and inserting the stuff bytes into the MPEG-2 transport stream, and transmitting the transport stream into which known data is inserted in replacement of the stuff bytes in the digital broadcast transmitter, and by detecting the known data from the received signal and using the known data for the synchronization and the equalization in the digital broadcast receiver.

According to an embodiment of the present general inventive concept, the operation performance of the equalizer can be improved through the proper adjustment of the amount and the pattern of the sequence of the known data inserted into the transport stream, and thus the receiving performance of the digital broadcast receiver can be improved.

Furthermore, the performance of the equalizer and the digital broadcast receiving performance can be enhanced by adjusting the sequence of the known data by a proper amount for the synchronization and the equalization of the receiver.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A digital broadcast receiver comprising:
    a tuner to receive a data stream comprising a field sync, a segment sync, and known data which is output from a trellis encoder of a digital broadcast transmitter after resetting internal memories of the trellis encoder;
    a known data detector to detect information about the known data from the data stream;
    a demodulator to perform synchronization based on the known data; and
    an equalizer to perform equalization at the receiver based on the known data.

2. The digital broadcast receiver as claimed in claim 1, wherein the known data is included in a predetermined position of the data stream according to control information to control insertion of the known data in the digital broadcast transmitter transmitting the data stream.

3. The digital broadcast receiver as claimed in claim 1, wherein the data stream is a data stream of which Reed Solomon (RS) parity is compensated for corresponding to memory reset in a RS encoder provided in the digital broadcast transmitter.

4. The digital broadcast receiver as claimed in claim 1, wherein the demodulator performs demodulating the data stream based on the known data.

5. The digital broadcast receiver as claimed in claim 1, wherein the known data detector detects another control information about a position and/or a length of the known data from the data stream, and detects the known data using the detected control information.

6. The digital broadcast receiver as claimed in claim 1, wherein the known data detector comprises:
    a symbol number detector to check a length of the known data inserted into the data stream and determining a position and a number of a known symbol according to coding of the known data;
    a segment generator for at least one segment according to the position and the number of the known symbol and generating a frame including the segment;
    an encoder to perform a coding process corresponding to a transmitting side of the generated frame; and
    a known symbol output unit to insert the known data into the position corresponding to the known symbol of the encoded frame and outputting the frame.

7. The digital broadcast receiver as claimed in claim 1, wherein the data stream is a data stream processed to have enhanced robustness.

8. A stream processing method of a digital broadcast receiver, the method comprising:
    receiving a data stream comprising a field sync, a segment sync, and known data which is output from a trellis encoder of a digital broadcast transmitter after resetting internal memories of the trellis encoder;
    detecting information about the known data from the data stream;
    performing synchronization based on the known data; and
    performing equalization at the receiver based on the known data.

9. The stream processing method as claimed in claim 8, wherein the known data is included in a predetermined position of the data stream according to control information for controlling insertion of the known data in the digital broadcast transmitter transmitting the data stream.

10. The stream processing method as claimed in claim 8, wherein the data stream is a data stream of which Reed Solomon (RS) parity is compensated for corresponding to memory reset in a RS encoder provided in the digital broadcast transmitter.

11. The stream processing method as claimed in claim 8, further comprising demodulating the data stream based on the known data.

12. The stream processing method as claimed in claim 8, wherein the detecting of the known data comprises detecting another control information about a position and/or a length of the known data from the data stream and detecting the known data using the detected control information.

13. The stream processing method as claimed in claim 8, wherein the detecting of the known data comprises:
    checking a length of the known data inserted into the data stream and determining a position and a number of a known symbol according to encoding of the known data;

generating at least one segment according to the position and the number of the known symbol and generating a frame including the segment;

performing a coding process corresponding to a transmitting side of the generated frame; and inserting the known data into the position corresponding to the known symbol of the encoded frame and outputting the frame.

14. The stream processing method as claimed in claim 8, wherein the data stream is a data stream processed to have enhanced robustness.

15. The digital broadcast receiver as claimed in claim 1, wherein the known data detector receives the data stream from the demodulator to detect the information about the known data and outputs the known data to the demodulator for the synchronization based on the known data.

16. A digital broadcast receiver comprising:

a tuner to receive a data stream comprising a field sync, a segment sync, and known data which is output from a trellis encoder of a digital broadcast transmitter after resetting internal memories of the trellis encoder;

a known data detector to detect information about the known data from the data stream;

a demodulator to perform synchronization based on the known data; and an equalizer to compensate channel distortion at the receiver based on the known data.

17. The stream processing method as claimed in claim 8, further comprising receiving the known data from the demodulator to detect the information about the known data and outputting the known data to the demodulator for the synchronization based on the known data.

18. A stream processing method of a digital broadcast receiver, the method comprising:

receiving a data stream comprising a field sync, a segment sync, and known data which is output from a trellis encoder of a digital broadcast transmitter after resetting internal memories of the trellis encoder;

detecting information about the known data from the data stream;

performing synchronization based on the known data; and performing compensation of channel distortion at the receiver based on the known data.

* * * * *